United States Patent [19]

Ichikawa

[11] Patent Number: 4,731,874

[45] Date of Patent: Mar. 15, 1988

[54] RADIO RECEIVER HAVING SECOND RECEIVER PART FOR AVOIDING INTERFERENCE SIGNALS

[75] Inventor: Nobuo Ichikawa, Iwaki, Japan

[73] Assignee: Alpine Electronic, Ltd., Japan

[21] Appl. No.: 834,748

[22] Filed: Feb. 28, 1986

[30] Foreign Application Priority Data

Feb. 28, 1985 [JP] Japan .............................. 60-28640[U]

[51] Int. Cl.$^4$ ............................................. H04B 1/16
[52] U.S. Cl. ................................... 455/258; 455/173; 455/182; 455/183
[58] Field of Search ............... 455/134, 136, 161, 164, 455/173, 182, 183, 186, 260, 258

[56] References Cited

FOREIGN PATENT DOCUMENTS

| 0036086 | 9/1981 | European Pat. Off. ............ 455/161 |
| 2840533 | 3/1980 | Fed. Rep. of Germany ...... 455/161 |
| 3020135 | 3/1982 | Fed. Rep. of Germany ...... 455/161 |
| 3034155 | 3/1982 | Fed. Rep. of Germany ...... 455/161 |

Primary Examiner—Robert L. Griffin
Assistant Examiner—Elissa Seidenglanz
Attorney, Agent, or Firm—Guy W. Shoup

[57] ABSTRACT

A radio receiver has a first radio receiving part which receives the signal of the desired radio broadcasting station, a first receiving field intensity detector which detects the receiving field intensity of the desired signal received by the first radio receiving part, a second radio receiving part which receives an interference signal having the frequency adjacent to the desired signal frequency, a second receiving field intensity detector which detects the receiving field intensity of the interference signal received by the second radio receiver, a receiving frequency controller which generates a control signal for controlling the frequency of the desired signal received by the first radio receiving part in such a direction to become more remote from the disturbing signal frequency based on the receiving field intensities of the desired signal and disturbing signal detected by the first and second receiving field intensity detectors, and a local oscillation frequency controller which controls a local oscillation frequency of the first radio receiving part based on the control signal.

2 Claims, 2 Drawing Figures

RADIO RECEIVER HAVING SECOND RECEIVER PART FOR AVOIDING INTERFERENCE SIGNALS

FIELD OF THE INVENTION

The present invention relates to a radio receiver and particularly to a radio receiver which can effectively prevent radio interference by the adjacent disturbing signals.

BACKGROUND OF THE INVENTION

In such areas where there are many radio broadcasting stations or during the night where many broadcasting signals of foreign countries can be received, interference by adjacent disturbing signals is easily generated and thereby the radio program of a desired station cannot be received in good receiving condition. It is necessary to make narrower the pass-band width of an IF filter provided between a tuner and intermediate frequency amplifier in order to receive a broadcasting signal from the desired station without interference by the adjacent disturbing signal, but the pass-band width of IF filter is restricted by the maximum modulation frequency and the maximum degree of modulation. If the pass-band width is narrowed ignoring such restriction, the distortion coefficient is deteriorated and the broadcasting signal cannot be received in good receiving condition. Therefore, in the radio receiver of the prior art, at least two IF filters having different pass-band widths are provided between the tuner and IF amplifier. If the broadcasting signal is disturbed by the adjacent disturbing signal, an IF filter having a narrow pass-band width is selected by the switch in order to eliminate interference by the adjacent disturbing signal. When the receiving signal is not interfered by the adjacent disturbing signal, an IF filter having a wider pass-band width is selected by the switch.

In the case of a radio receiver to be mounted on a vehicle (car radio), the conditions of signals to be received are changing from time to time. Therefore, the car radio receiver of the prior art is required to adjust the pass-band width of the IF filter with the switch, etc. in accordance with the receiving conditions and moreover fine control of pass-band width requires many IF filters and the switching circuit. Thereby, constitution is complicated and conditions of interference by the adjacent disturbing signal cannot be obtained accurately, thus disabling reception of radio program in good receiving condition.

SUMMARY OF THE INVENTION

Therefore, it is an object of the present invention to provide a radio receiver which accurately grasps corrects the condition of interference by the adjacent disturbing signal and executes fine control of receiving conditions with simplified constitution.

A radio receiver of the present invention comprises a first radio receiving part which receives the signal of the desired radio broadcasting station, a first receiving field intensity detector which detects the receiving field intensity of a desired signal received by said first radio receiving part, a second radio receiving part which receives an interference signal having a frequency adjacent to the desired signal frequency, a second receiving field intensity detector which detects the receiving field intensity of the interference signal received by the second radio receiver, a receiving frequency controller which generates a control signal for controlling the frequency of the desired signal received by the first radio receiving part in a direction away from the disturbing signal frequency based on the receiving field intensities of the desired signal and disturbing signal detected by the first and second receiving field intensity detectors, and a local oscillation frequency controller which controls a local oscillation frequency of the first radio receiving part based on said control signal. A receiving field intensity $S_A$ of the desired signal received by the first radio receiving part is detected by the first receiving field intensity detector and simultaneously a receiving field intensity $S_B$ of the disturbing signal received by the second radio receiving part is detected by the second receiving field intensity detector. The receiving frequency controller controls the frequency $f_0$ of the desired signal received by the first radio receiving part based on the receiving field intensities $S_A$, $S_B$ of the desired signal and disturbing signal. The frequency $f_0$ of the desired signal is not changed when $S_A \geq S_B$ or the control signal is generated so that the the desired signal frequency changes to $f_0$ from $f_0 \pm \Delta f$ when $S_A < S_B$. The positive or negative increments in the above relation are determined in such a way that $f_0$ becomes more remote from the frequency of disturbing signal.

The local oscillation frequency controller of PLL structure controls the local oscillation frequency of the first radio receiving part to $(f_0 + f_{IN})$ based on said control signal. $f_{IN}$ is an intermediate frequency. Thereby, the local oscillation frequency changes in such a direction that the interference is eliminated and as a result a radio program can be received without interference. The receiving frequency controller inputs the second control signal to the second local oscillation frequency controller of the PLL structure so that the second radio receiving part is capable of receiving the disturbing signal sent from the adjacent disturbing station.

DETAILED DESCRIPTION OF THE INVENTION

Figure 1:
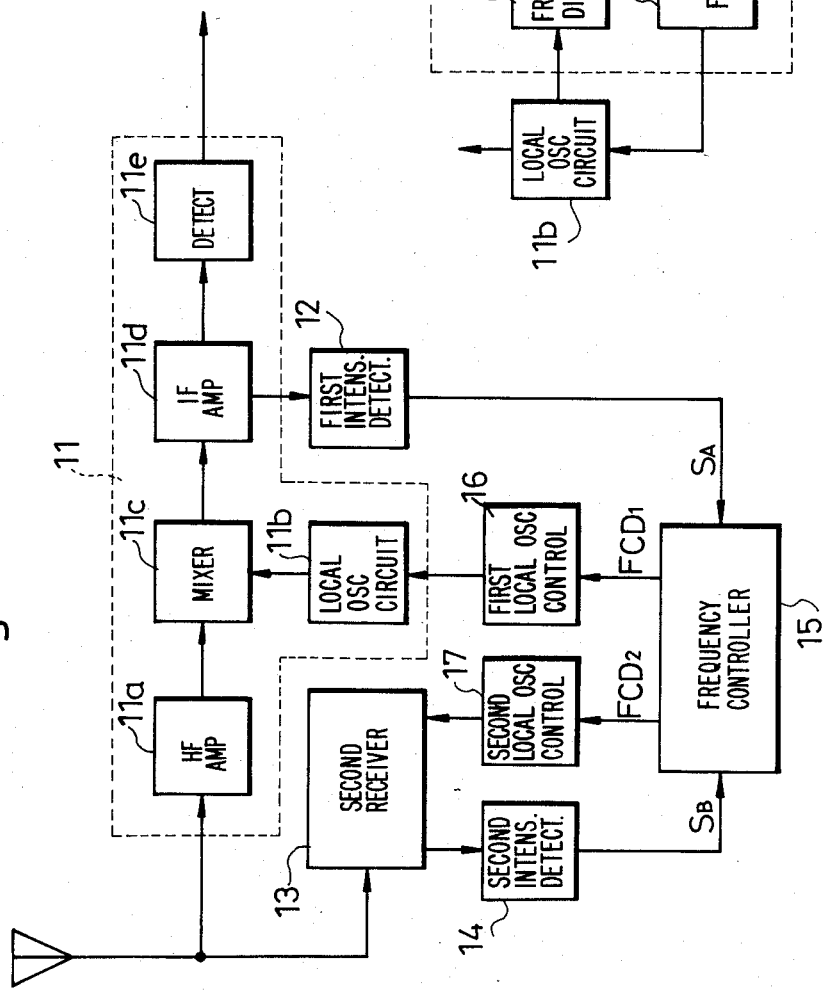
FIG. 1 is a block diagram of a radio receiver of the present invention.

In FIG. 1, numeral 11 denotes a first radio receiving part which receives signals from the desired radio broadcasting station, 12 is a first receiving field intensity detector which detects a receiving field intensity of the desired signal received by the first radio receiving part 11, 13 is a second radio receiving part which receives disturbing signals sent from the other stations of frequencies adjacent to the desired signal frequency, 14 is a second receiving field intensity detector which detects the receiving field intensity of disturbing signals received by the second radio receiving part 13 and 15 is a receiving frequency controller composed of a microcomputer which generates frequency control data FCD 1 for controlling the frequency of said desired signal based on the receiving field intensities $S_A$, $S_B$ of the desired signal and disturbing signal detected by the first and second receiving field intensity detectors 12, 14 and also generates frequency control data FCD 2 for controlling the frequency of the disturbing signal received by the second radio receiving part 13. 16 is a first local oscillation frequency controller of PLL structure which controls the local oscillation frequency of the first radio receiving part 11 based on the frequency control data FCD 1, and 17 is a second local oscillation frequency controller of PLL structure which controls the local oscillation frequency of the second radio receiving part 13 based on the frequency control data VCD 2.

The first radio receiving part 11 is composed of a high frequency amplifier 11a, a local oscillation circuit 11b, a mixer 11c, an intermediate frequency amplifier 11d, and a detector 11e. The second radio receiving part 13 comprises, although not illustrated, a high frequency amplifier, a local oscillation circuit, a mixer and an intermediate frequency amplifier.

Figure 2:
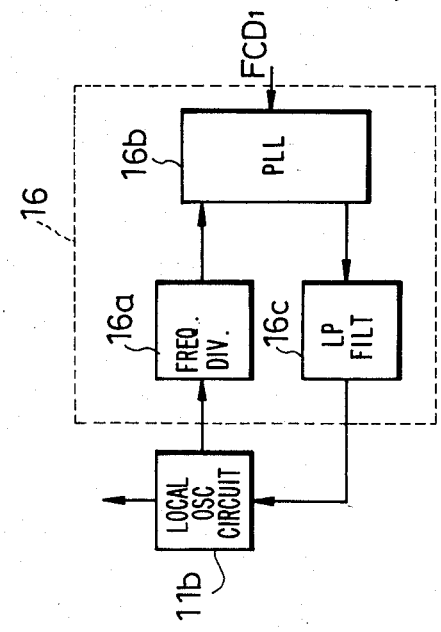
FIG. 2 is a block diagram of the local oscillation frequency controller shown in FIG. 1.

The local oscillation frequency controller 16 comprises, as shown in FIG. 2, a frequency dividing circuit 16a which divides the frequency sent from the local oscillation circuit 11b, a PLL circuit 16b and a low-pass-filter 16c and operates so that the oscillation frequency of local oscillation circuit 11b becomes the frequency corresponding to the frequency control data FCD 1. Namely, the local oscillation frequency controller 16 controls the oscillation frequency of the local oscillation circuit 11b based on the frequency control data FCD 1 so that said oscillation frequency becomes higher than the desired frequency $f_0$ by intermediate frequency $f_{IN}$. The local oscillation frequency controller 17 also has the same structure as FIG. 2 and controls the oscillation frequency in the second radio receiving part 13 so that it becomes higher than the disturbing frequency by the intermediate frequency based on the frequency control data FCD 2.

Next, operations of a radio receiver of the present invention are explained here under.

(1) When a channel selection switch (not illustrated) is pressed for selecting a station, the selection data is input to the receiving frequency controller 15 of the microcomputer structure.

(2) Thereby, the receiving frequency controller 15 sends the first frequency control data FCD 1 corresponding to the desired frequency sent from the desired station selected to the local oscillation frequency controller 16 and causes the first radio receiving part 11 to receive the signal sent from the desired station.

The receiving frequency controller 15 also inputs the second frequency control data FCD 2 corresponding to said disturbing signal to the local oscillation frequency controller 17 in order to cause the second radio receiving part 13 to receive the disturbing signal sent from the disturbing station adjacent to the desired station. When a frequency of desired station is $f_0$, a channel frequency is $f_c$, the frequencies $f_1$, $f_2$ of disturbing signal sent from the adjacent disturbing station can be expressed by the following expression.

$$f_1 = f_0 + f_c, \quad f_2 = f_0 - f_c$$

Therefore, the frequency control data FCD 2 is first generated in order to receive a disturbing signal of the frequency $f_1$.

(3) A receiving field intensity $S_A$ of the desired signal received by the first radio receiving part 11 is detected by the first receiving field intensity detector 12 connected to the intermediate frequency amplifier 11d, while a receiving field intensity $S_B$ of the disturbing signal received by the second radio receiving part 12 is detected by the second receiving field intensity detector 14 and these are respectively input to the receiving frequency controller 15.

(4) The receiving frequency controller 15 compares the receiving field intensities $S_A$, $S_B$ of the desired signal and disturbing signal and changes the first and second frequency control data FCD 1, FCD 2 on the basis of the result.

For example, when $S_A \geq S_B$, interference resulting from the adjacent disturbing signal of frequency $f_1$ is not generated and thereby the frequency $f_0$ of desired signal is not changed (the first frequency control data FCD 1 is not changed), and only the second frequency control data FCD 2 is changed causing the second radio receiving part 13 to receive the adjacent disturbing signal of frequency $f_2$. Thereafter, detection of receiving field intensities and comparison control in the steps (3) and (4) are executed.

(5) Meanwhile, when $S_A < S_B$, interference by the adjacent disturbing signal of frequency $f_1$ is generated and therefore the receiving frequency controller 15 changes the first frequency control data FCD 1 so that the desired frequency changes to $f_0$ from $f_0 \pm \Delta f$ (FCD 2 is not changed). The sign in the above expression is determined in such a way that as the frequency becomes more remote from the disturbing frequency. Namely, since $f_1 > f_0$, the sign becomes $-$ (in the case of $f_2$, since $f_2 < f_0$, the sign becomes $+$). Thereafter, the processings after the steps (3) are repeated until the interference disappears. When interference by the disturbing signal of frequency $f_1$ disappears, said control is repeated for the disturbing signal of the frequency $f_2$.

(6) Upon completion of above processings to the adjacent disturbing signals of $f_1$ and $f_2$, these processings are repeated again.

The interference by the disturbing signal sent from an adjacent disturbing station is explained above, but it is of course possible to form the circuit considering interference by the signals sent from foreign countries. In the above explanation, interference is checked from the result of comparison between the values $S_A$ and $S_B$ but it is also possible to check such interference from comparison between $S_A$ and $kS_B$. Moreover, the present invention can be adapted not only to an FM radio receiver but also to an AM radio receiver.

According to the present invention, a radio receiver is composed of a first radio receiving part which receives the signal sent from the desired radio broadcasting station, a first receiving field intensity detector which detects a receiving field intensity of the desired signal received by the first radio receiving part, a second radio receiving part which receives a disturbing signal having a frequency adjacent to the desired signal frequency, a second receiving field intensity detector which detects the receiving field intensity of a disturbing signal received by the second radio receiving part, a receiving frequency controller which generates a control signal which controls the desired signal received by the first radio receiving part in such a way that it becomes more remote from the frequency of the disturbing signal based on the receiving field intensities of the desired signal and disturbing signal detected by the first and second receiving field intensity detectors and a local oscillation frequency controller which controls the local oscillation frequency of the first radio receiving part based on said control signal and therefore it realizes good receiving conditions without inteference. Moreover, fine control can also be realized with a simplified structure by setting the desired frequency to an adequate range of change.

What is claimed is:

1. A radio receiver comprising:

a first radio receiving part having means for receiving a desired radio signal of a given frequency transmitted from a broadcasting station, means for generating a first local oscillation frequency, and means for mixing the received radio signal with the generated first local oscillation frequency to obtain an intermediate frequency (IF) signal corresponding to the desired signal;

a first detector connected to an output of the first radio receiving part for detecting a field intensity of the desired signal received by the first radio receiving part;

a second radio receiving part having means for receiving a disturbing radio signal having a frequency adjacent the frequency of the desired radio signal;

a second detector connected to an output of the second radio receiving part for detecting a field intensity of the disturbing signal received by the second radio receiving part;

a receiving frequency controller connected to the first and second detectors having means for comparing the field intensity of the desired signal with the field intensity of the disturbing signal, and for providing a first control signal for shifting the IF frequency of the desired signal in a direction away from the frequency of the disturbing signal based upon said comparing of field intensities; and a first local oscillation frequency controller receiving the first control signal output of the receiving frequency controller and providing an output to the first radio receiving part for controlling said means for generating the first local oscillation frequency so as to shift the IF frequency of the desired signal in the direction away from the frequency of the disturbing signal.

2. A radio receiver according to claim 1, further comprising:

said second radio receiving part having means for generating a second local oscillation frequency, and means for mixing the received disturbing signal with the generated second local oscillation frequency to obtain an intermediate frequency (IF) signal corresponding to the disturbing signal;

said receiving frequency controller having means for providing a second control signal for shifting the IF signal obtained by the second radio receiving part to a frequency corresponding to another disturbing signal; and a second local oscillation frequency controller receiving the second control signal output of the receiving frequency controller and providing an output to the second radio receiving part for controlling said means for generating the second local oscillation frequency so as to shift the IF signal obtained by the second radio receiving part to the frequency corresponding to another disturbing signal.

* * * * *